United States Patent [19]
Margolin

[11] 3,940,758
[45] Feb. 24, 1976

[54] EXPANDABLE KEYBOARD FOR ELECTRONIC POCKET CALCULATORS AND THE LIKE

[76] Inventor: George D. Margolin, 174 W. 76 St., New York, N.Y. 10023

[22] Filed: Sept. 20, 1974

[21] Appl. No.: 507,756

[52] U.S. Cl. ............ 340/337; 200/5 A; 235/156; 340/365 R
[51] Int. Cl.² .................................. G06F 3/02
[58] Field of Search....... 340/337, 365 R; 178/17 C; 197/98, 100; 200/5 A; 235/156

[56] References Cited
UNITED STATES PATENTS

| | | |
|---|---|---|
| 3,226,712 | 12/1965 | Lens et al. ............ 340/365 R |
| 3,676,656 | 7/1972 | Schmidt ............ 235/156 |
| 3,755,806 | 8/1973 | Bunting ............ 340/336 |
| 3,808,384 | 4/1974 | Bonlanger ............ 340/365 R |
| 3,830,352 | 8/1974 | Kolpex ............ 197/19 X |

*Primary Examiner*—David L. Trafton

[57] ABSTRACT

An expandable keyboard for a pocket-type calculator is made in modular form to electrically interconnect to form a keyboard much larger than that of a familiar pocket calculator. The keyboard portions are hinged together normally forming a stack, which occupies along with the display and the electronics, a space about as large as a conventional pocket calculator.

9 Claims, 9 Drawing Figures

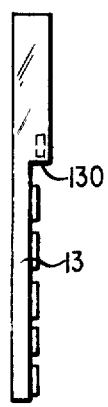
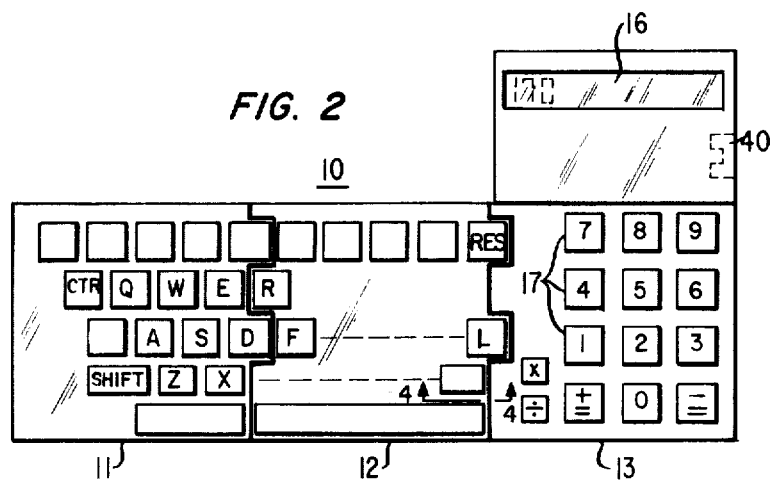
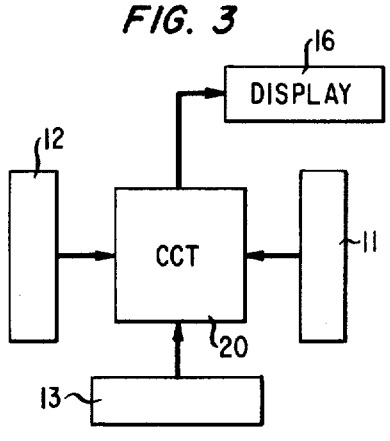
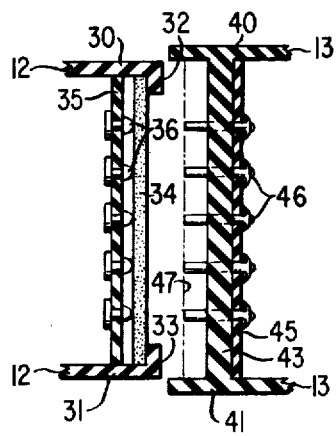
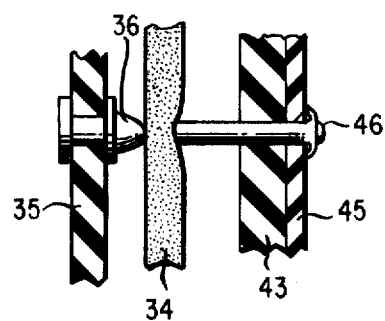

EXPANDABLE KEYBOARD FOR ELECTRONIC POCKET CALCULATORS AND THE LIKE

FIELD OF THE INVENTION

This invention relates to electronic apparatus, and more particularly to expandable keyboards for the operation of such apparatus.

BACKGROUND OF THE INVENTION

It is evident from a glance at any pocket calculator that the minimum size of such apparatus is determined by the keyboard and by the display arrangements; not by the electronics within the device. Of the two determining factors, the keyboard occupies, by far, the greater amount of surface space. With maximum surface dimensions of about three and one-half inches by seven inches, space available for a full spectrum of function keys is at a premium. Particularly when the human factors are considered and minimum key size is determined, it is clear that fewer keys are employed than would otherwise be permitted by the electronics within the calculator. Space within the calculator goes unused instead.

BRIEF DESCRIPTION OF THE INVENTION

The present invention is based on the realization that a folding or modular arrangement for a keyboard for a pocket electronic device would provide a much greater surface area for a keyboard than would otherwise be possible. Yet, when the keyboard is folded, the device would still be pocket size. To this end, a keyboard of familiar layout for a full-size desk top data terminal is illustratively organized in three modular portions, each having surface dimensions equal to that available with a pocket calculator. The portions hinge or snap fit in a side-by-side relationship with a main portion conveniently affixed to a housing for the electronics for the various functions. Electrical interconnection between the side portions of the modular or folding keyboard arrangement is achieved at the edges of the portions by means of arrays of electrical interfaces exposed at the mating edges for interconnection.

BRIEF DESCRIPTION OF THE DRAWING

FIGS. 1 and 2 are side and top views of a keyboard arrangement in accordance with this invention;

FIG. 3 is a block diagram of apparatus including a keyboard arrangement in accordance with this invention;

FIGS. 4 and 5 are sectional views of portions of the keyboard arrangement of FIGS. 1 and 2;

DETAILED DESCRIPTION

Figure 6:
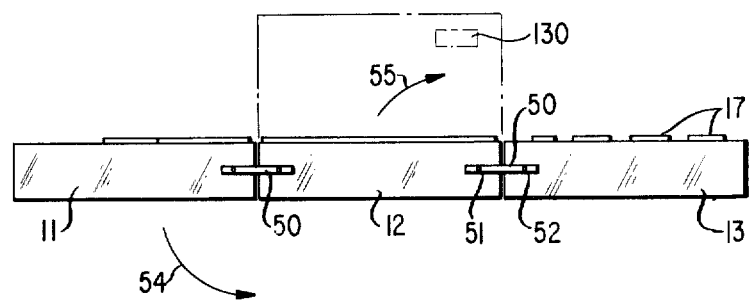
FIGS. 6 and 7 are side views of the arrangement of FIGS. 1 and 2 illustrating hinge and latch arrangements for the various keyboard portions thereof.

FIGS. 1 and 2 show side and top views of an illustrative modular or foldable keyboard arrangement 10 in accordance with this invention. The keyboard arrangement includes three modular portions 11, 12, and 13 which interconnect electrically and hinge together mechanically. Each keyboard portion is nominally 3.25 inches by 3.25 inches, completely consistent in size and organization with any familiar pocket calculator. In fact, portion 13 considered alone as shown in the absence of portions 11 and 12 forms a familiar pocket calculator, portion 13 in FIG. 2 illustratively being affixed to a housing for both a display 16 and an electronic circuit. The electronic circuit is operative on display 16 for selective activation thereof in response to the selective depression of keys 17 of the keyboard portion 13 in conventional calculator fashion. Portion 13, then, with display 16 is illustratively operative as a familiar pocket calculator. The electronic circuit, therefore, is conventional and is well understood and commercially available.

FIG. 3 represents the electronic circuit as a block 20, portion 13 of the modular keyboard being represented as a block also designated 13. A conventional pocket calculator is thus represented in FIG. 3 by the blocks 13, 16, and 20. In accordance with an aspect of the present invention, circuit 20 includes additional electrical interconnection paths over and above those operative by the keys of portion 13. These additional paths are available for interconnections illustratively at the edge of portion 13 for mating with portions 11 and 12 of the keyboard arrangement of FIG. 2. The interconnection of portions 11 and 12 is represented in FIG. 3 by the addition of blocks 11 and 12 there. Circuit 20, in accordance with this embodiment of this invention, is operative in response to selective activation of the keys in portions 11 and 12 to apply different signals to display 16 than are applied by selective activation of the keys of portion 13. Circuit 20 thus can be seen to be available to provide a considerably greater number of functions (i.e., alpha-numeric) than a circuit for a pocket calculator would normally be called on to perform. Additional interconnection paths in this circuit over and above what is shown in the above-mentioned pocket calculator circuit are brought to the edge of portion 13 for interconnection.

One arrangement for interconnection is illustrated in FIGS. 4 and 5. FIG. 4 is a cross-section view of a part of portion 13 of the keyboard arrangement taken along line 2-2' of FIG. 2 along with a cross section of the mating portion of portion 12. In this illustrative embodiment, the top and bottom faces 30 and 31 of portion 12 form lips 32 and 33 for receiving a conductive elastomer side member 34. Portion 12 also houses a double-sided printed circuitboard 35 terminating to the right with metallic bumps 36. The bumps may be seen to be closely spaced with respect to elastomer side member 34.

Portion 13 is adapted to mate with portion 12 to make contact with metallic bumps 36. To this end, portion 13 includes top and bottom surfaces 40 and 41 which protrude beyond side wall 43 thereof in a manner to allow portion 12 to be inserted therebetween as indicated in FIG. 4. A printed circuit board 45 is secured to side wall 43 with metallic pins or eyelets 46 extending through both board 45 and side wall 43. Pins 46 extend beyond the side wall and thus are exposed or at least available for contact at the side wall. it is convenient for an insulating layer such as polyurethane layer, indicated by broken line 47 in FIG. 4, to cover side wall 43 to a thickness equal to the exposed length of the pins to provide a relatively smooth side wall appearance to the module portions.

In either case, when two portions of the keyboard arrangement are moved into an open or electrically interconnected position, bumps 36 and associated pins 46 compress localized regions of elastomer 34 to make contact therebetween as indicated most clearly in an expanded view of a representative bump and pin in FIG. 5. Elastomer layer 34 is typically a silver-filled silicone elastomer which provides localized electrical contact therethrough when compressed as is the case between the bump and pin shown in FIG. 5.

Figure 7:
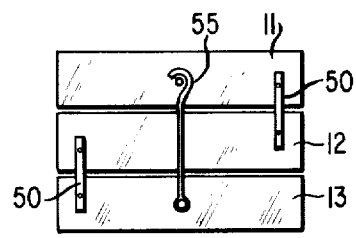

A connector 50, shown in FIG. 6, acts as a guide to align pins and bumps for effecting suitable electrical interconnections between two adjacent portions of the module. FIG. 6 shows portions 11, 12, and 13 of the keyboard arrangement of FIG. 1 in an open or interconnected position with connectors or hinges 50 in position. Each connector 50 includes two studs (51 and 52) with which it is slidably engaged to adjacent portions. The keyboard portions are normally in one of two positions with respect to one another, the open or interconnected position shown in FIG. 6 or the closed or stacked position shown in FIG. 7. Hinges 50 slide to allow portions 12 and 13 to be separated electrically and to be pivoted into face-to-face relationship as shown in FIG. 7. Of course, four hinges of this type are employed to allow the three portions of the keyboard, shown in FIGS. 2, 6, and 7, to adjust into the two positions as needed. But the hinges between portions 11 and 12 allow the two portions to stack into a back-to-back relationship as indicated by the curved arrow 54 in FIG. 6 and as shown in FIG. 7 whereas the hinges between portions 12 and 13 allow the two portions to stack in a face-to-face relationship as indicated by the curved arrow 55 in FIG. 7. Actually, slidable hinges are easily adapted to allow adjacent portions of the keyboard arrangement to fold in either direction with respect to one another.

A latch 55 shown in FIG. 7 (or a suitable snap fastener arrangement) retains the portions in the stacked position for convenience of carriage.

Figure 9:
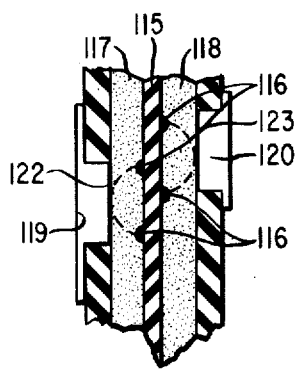
FIGS. 8 and 9 are side and cross-sectional views of alternative embodiments of this invention.

It may be appreciated that when the assembly is in the stacked position, the keys may be raised from the surfaces as shown in FIG. 6. If this is the case, the rear surfaces of the portions against which a face of another portion abuts when stacked may include recesses to receive the raised buttons so that the stack may occupy as little space as possible. On the other hand, keys are available which are not raised. In this case the recesses are not necessary. Since the electronics occupy very little space, a three-portion stack as shown in FIG. 9 occupies about an inch and extends to about 10 inches when in the open position, respectively.

The individual portions of the foregoing illustrative embodiment fold out from portion 13 to the left thereof into the spread or open position shown in FIG. 2. The keys are disposed typically to form a familiar extended keyboard such as an electronic typewriter or intelligent terminal keyboard. The electronic circuits for such keyboards for controlling the operating of display 16 are well known. All that is necessary in addition herein is, that if all the electronics for the extended keyboard functions are included within portion 13, the various electrical paths are not directly controlled by the keys of portion 13 be terminated at the (side or) sides of portion 13 for interconnection as shown with electrical paths from the keyboards of portions 11 and 12. The separate keyboard portions may include any suitable keyboard arrangement, inductive, capacitive, heat sensitive, etc., capable of applying a signal to a conductor for operation, via the interconnections shown, for operating the electronic circuitry in conventional fashion.

Figure 8:
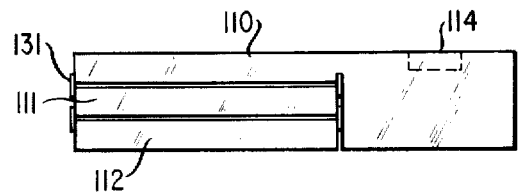

It may be desirable to design the keyboard modules so that portions 11 and 12 fold behind portion 13 of FIG. 2. FIG. 8 shows an illustration of one such arrangement in which a keyboard portion 110 is affixed to the housing for the electronic circuit and display of a pocket calculator and portions 111 and 112 stack to the rear of portion 110. Portions 111 and 112 may hinge together to spread to one side of the portion 110 when opened, to provide the arrangement of FIG. 2 when in a spread position or portions 111 and 112 may hinge individually to either side of portion 113. The display is identified by broken block 114 in the Figure.

It is possible in accordance with one aspect of this invention to employ a familiar alpha-numeric keyboard arrangement of a conventional input data terminal as shown in FIG. 2 for portions 11 and 12 but divided into three portions as shown in FIG. 6 rather than into two. When in a stacked position, the three keyboard portions would appear much as shown in FIG. 7. In this instance, the rear surface of one of the portions is conveniently adapted to include the keyboard layout of a pocket calculator similar to the keyboard arrangement shown for portion 13 in FIG. 2. Such an arrangement perhaps is better visualized by considering portion 12 of FIG. 2 to house display 16 and the electronics. In this case, portions 11 and 13 would fold on top of portion 12 and the reverse side of say portion 13 would include the keyboard layout shown for the front face of portion 13 in FIG. 2.

FIG. 9 shows a cross-sectional view of a portion 13 including keys on both surfaces thereof. The portion, in this instance, includes a printed circuitboard 115 having metallic bumps 116. Elastomer layers 117 and 118 are disposed to the sides of board 115. Keys 119 and 120 include conductive layers 122 and 123 for completing an electrical path between associated bumps 116 when depressed as indicated by the broken lines in the Figure. The printed circuit in such an arrangement is arranged to include a pair of bumps for each key.

In embodiments in which the rear surface of a keyboard module also includes a keyboard, electrical interconnections are provided when that portion is in either the stacked or in the open position. In this instance, the keyboard portion housing the electronics, such as portion 13 of FIG. 2, accordingly, includes a top edge adapted for electrical interconnection as shown in FIGS. 1 and 6. Specifically, if portion 12 is affixed to the housing for the display and portion 13, for example, is adapted in this manner, portion 13 may be spring loaded, via hinges 50 of FIG. 6, with respect to portion 12 to pressure contact metallic eyelets, represented by broken block 130 in housing 131 shown in phantom in FIG. 6, when stacked. Once again, the apparatus is operative as a pocket calculator when stacked and as a full terminal when open.

When a relatively small keyboard of a pocket electronic device such as a pocket calculator is extended to provide an enlarged keyboard with a more complete arrangement of function keys, the electronic circuits operative in response to selective operation of those keys also is augmented to respond in a useful manner. If the added functions relate to alphabetic functions, the display may include alpha-numeric capabilities and the electronic circuit housed within the device may be increased in a well understood manner to perform such functions. Alternatively, the apparatus may be adapted such that the added functions may be performed with an external second electronic circuit found in existing modems. In this instance access to the modem may be realized via a cable connected to a connector 140 housed, illustratively, in portion 13 of FIG. 2. The added functions need only be organized so that the keys provide a conventional ASCII code.

Of course, a keyboard for a pocket calculator may itself be implemented in two or more portions in accordance with this invention. With such an arrangement, the pocket calculator may be reduced in size to, for example, wrist watch size. Still the keys of the keyboard would be of a size now employed for pocket calculators. This aspect of the invention emphasizes that the size of finger-operated electronic equipment may be reduced below that anticipated by human factors alone. For example, the inclusion in a keyboard of multiple shift keys may allow the keys of a keyboard to perform double or even triple functions but they do not allow a reduction in size of the equipment below that dictated by the keyboard array. In accordance with the present invention, the equipment may be reduced to a size dictated by the electronics housed within it rather than by the size of the keyboard and the keys and spacings therein.

A hingeable keyboard in accordance with the present invention has the further advantage that the keyboard can always provide a familiar format to the operator. With shift keys (to allow the keyboard to serve double functions) operator confusion due to an unfamiliar and a changing key format is avoided only to some extent, for example, by combining logically paired functions.

FIG. 9 depicts a two-sided keyboard arrangement as was mentioned hereinbefore. It should be clear that such an arrangement can be implemented merely by defining (i.e. printing) a keyboard format on each face of say an elastomeric keyboard arrangement. The two keyboards would show different functions and operate differently depending upon whether interconnection was achieved via a side interconnection or at 140 of FIG. 1. The electrical keyboard interconnections would be the same and would be operative in the same mode regardless of which face (front or rear) defined the depressed key.

The invention is disclosed in terms of a modular keyboard arrangement which hinges from a stacked position, convenient for carrying, into an open and electrically interconnected position, convenient for operation. In this manner, an expandable keyboard arrangement permits a relatively large keyboard for a pocket size electronic device. The keyboard, on the other hand, may be expanded in accordance with this invention by slide or roller-type implementations. A roller-type implementation may, for example, be electrically interconnected at a top portion and unrolled from the bottom to expose additional keys. Thin flexible keyboards easily permit such an implementation.

What has been described is considered only illustrative of the principles of this invention. Therefore, those skilled in the art can devise various embodiments of this invention in accordance with those principles within the spirit and scope thereof as encompassed by the following claims:

What is claimed is:

1. A keyboard arrangement including a first array of keys operative selectively on a first electronic circuit, said keyboard arrangement being physically detachable into a plurality of portions each bearing a section of said array of keys, each of said portions being adapted to electrically interconnect with adjacent keyboard portions for selective operation on said first electronic circuit.

2. A keyboard arrangement in accordance with claim 1 wherein said keyboard comprises first and second portions hinged together for pivoting into a stacked or into a spread position for operation, said portions being adapted for electrical interconnection when in the spread position.

3. A keyboard arrangement in accordance with claim 2 wherein said first portion houses said first electronic circuit and a display connected to said circuit and said second portion is operative upon said first electronic circuit in response to the selective operation of keys thereon when said portions are pivoted into said spread positions.

4. A keyboard arrangement in accordance with claim 1 wherein said keyboard comprises first, second and third portions, said portions being hinged together for pivoting into a stacked or into a spread position for operation, said portions being adapted for electrical interconnection when in the spread condition.

5. A keyboard arrangement in accordance with claim 4 wherein said first portion houses said first electronic circuit and a display and said second and third portions are operative upon said first electronic circuit in response to the selective operation of keys thereon when said portions are in said spread position.

6. A keyboard arrangement in accordance with claim 5 wherein said second portion includes front and rear surfaces and said front surface includes said corresponding section of said array of keys, wherein said rear surface includes a second array of keys.

7. A keyboard arrangement in accordance with claim 6 organized so that said first, second and third portions are interconnected to expose said first array of keys when in a spread position and to expose only said second array of keys when in a stacked position, said third portion being adapted to interconnect electrically with said first electronic circuit when in the spread or in the stacked position.

8. A pocket electronic device housing a display and an electronic circuit, a first keyboard integral with said device and selectively operative on said circuit for activating said display, said device being adapted for electrical interconnection with a second keyboard physically moveable with respect thereto, said circuit being adapted to respond to the selective depression of the keys of said second keyboard for operating said display.

9. A pocket electronic device housing a display and an electronic circuit, said device including a keyboard having a first set of keys selectively operative on said circuit for controllably activating said display in a first manner, said keyboard being adapted to expand to include a second set of keys physically moveable with respect thereto in addition to said first set, said circuit being adapted to respond to the keys of said second set for controllably activating said display in a second manner.

* * * * *